United States Patent
Fan et al.

(10) Patent No.: US 7,619,305 B2
(45) Date of Patent: Nov. 17, 2009

(54) SEMICONDUCTOR PACKAGE-ON-PACKAGE (POP) DEVICE AVOIDING CRACK AT SOLDER JOINTS OF MICRO CONTACTS DURING PACKAGE STACKING

(75) Inventors: Wen-Jeng Fan, Hsinchu (TW); Li-Chih Fang, Hsinchu (TW); Ron Iwata, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 195 days.

(21) Appl. No.: 11/889,693

(22) Filed: Aug. 15, 2007

(65) Prior Publication Data
US 2009/0045523 A1 Feb. 19, 2009

(51) Int. Cl.
H01L 23/02 (2006.01)
H01L 23/52 (2006.01)
H01L 23/48 (2006.01)
H01L 29/40 (2006.01)
H01L 23/488 (2006.01)
H01L 23/485 (2006.01)

(52) U.S. Cl. .................. 257/686; 257/779; 257/780; 257/E23.023; 257/E23.02

(58) Field of Classification Search .................. 257/686, 257/779, 780, E23.023, E23.02
See application file for complete search history.

(56) References Cited

U.S. PATENT DOCUMENTS

| | | | |
|---|---|---|---|
| 6,278,616 B1 * | 8/2001 | Gelsomini et al. | 361/803 |
| 6,476,503 B1 | 11/2002 | Imamura et al. | |
| 6,894,378 B2 * | 5/2005 | Winderl | 257/686 |
| 6,924,550 B2 * | 8/2005 | Corisis et al. | 257/686 |
| 7,265,441 B2 * | 9/2007 | Reiss et al. | 257/685 |
| 2001/0054758 A1 * | 12/2001 | Isaak | 257/686 |
| 2005/0184377 A1 * | 8/2005 | Takeuchi et al. | 257/686 |
| 2006/0138647 A1 | 6/2006 | Crisp et al. | |
| 2007/0045788 A1 * | 3/2007 | Suzuki et al. | 257/666 |
| 2007/0069396 A1 * | 3/2007 | Baek et al. | 257/782 |
| 2007/0148822 A1 * | 6/2007 | Haba et al. | 438/110 |

* cited by examiner

Primary Examiner—Luan C Thai
(74) Attorney, Agent, or Firm—Muncy, Geissler, Olds & Lowe, PLLC

(57) ABSTRACT

A stacked semiconductor device primarily comprises semiconductor packages with a plurality of micro contacts and solder paste to soldering the micro contacts. Each semiconductor package comprises a substrate and a chip disposed on the substrate. The micro contacts of the bottom semiconductor package are a plurality of top bumps located on the upper surface of the substrate. The micro contacts of the top semiconductor package are a plurality of bottom bumps located on the lower surface of the substrate. The bottom bumps are aligned with the top bumps and are electrically connected each other by the solder paste. Therefore, the top bumps and the bottom bumps have the same soldering shapes and dimensions for evenly soldering to avoid breakages of the micro bumps during stacking.

24 Claims, 5 Drawing Sheets

SEMICONDUCTOR PACKAGE-ON-PACKAGE (POP) DEVICE AVOIDING CRACK AT SOLDER JOINTS OF MICRO CONTACTS DURING PACKAGE STACKING

FIELD OF THE INVENTION

The present invention relates to a 3D (three-dimensional) stacked package device with multiple semiconductor packages, especially, to a semiconductor package-on-package device free from cracks at solder joints of micro contacts during package stacking.

BACKGROUND OF THE INVENTION

When the dimension of a printed circuit board becomes smaller and smaller, the available surface for placing IC components becomes smaller and smaller as well. Conventionally, a plurality of IC semiconductor packages are side-by-side mounted on a printed circuit board which no longer can be implemented in advanced miniature electronic products. Therefore, in order to meet the requirements of smaller surface-mounting area and higher densities of components, 3D package is proposed by vertically stacking multiple semiconductor packages. This is also called POP (Package-On-Package) device. The most common way to vertically stacking multiple semiconductor packages is to use solder balls or an interposer substrate with solder paste on both sides thereof. If use solder balls, besides of solder joint crack issue, the solder ball size should be large enough for stack spacing that will easily cause solder bridging or contamination issue. Moreover, due to the pitch between the large solder balls, the pin counts and the trace layout are limited. The conventional POP device cannot accord with fine pitch applications in miniature electronic devices. Furthermore, because of CTE mismatching between the stacked semiconductor packages and spacer, such as solder balls or interposer substrate, the soldering joints are easily broken. The interposer substrate has an opening at the center and a plurality of PTHs disposed around the opening, the cost will increase.

A conventional semiconductor package with micro-contacts and a conventional POP device with micro-contacts are revealed in US patent application publication No. 2006/0138647 and U.S. Pat. No. 6,476,503 respectively. As shown in FIG. 1, a semiconductor POP device 100 utilizing micro-contact technology primarily comprises a first semiconductor package 110, a second semiconductor package 120, and solder paste 130 at micro-contacts where the second semiconductor package 120 is stacked on the first semiconductor package 110 and is electrically connected to each other by solder paste 130. The first semiconductor package 110 includes a first substrate 111, a first chip 112 disposed on an upper surface 111A of the substrate 111, a plurality of bumps 113 disposed on a lower surface 111B of the substrate 111, and a first encapsulant 115. The bonding pads of the first chip 112 are electrically connected to the first substrate 111 by a plurality of first bonding wires 114 passing through the first slot 111C. The first bonding wires 114 are encapsulated by the first encapsulant 115. The second semiconductor package 120 includes a second substrate 121, a second chip 122 disposed on the upper surface 121A of the substrate 121, a plurality of bumps 123 disposed on the lower surface 121B of the substrate 121 such as copper bumps or non-reflow pillar bumps, and a second encapsulant 125. The bonding pads of the second chip 122 are electrically connected to the substrate 121 by a plurality of second bonding wires 124 passing through the second slot 121C. The second bonding wires 124 are encapsulated by the second encapsulant 125. A plurality of connecting pads 111D are disposed on the upper surface 111A of the first substrate 111 of the first semiconductor package 110. The bumps 123 of the second semiconductor package 120 are connected with the corresponding connecting pads 111D of the first semiconductor package 110 by the solder paste 130 to achieve micro-contact configuration. Since the first semiconductor package 110 and the semiconductor package 120 are mechanically stacked and electrically connected by the micro contacts so that the pin counts can be increased and the available area for trace layout can also be increased, moreover, the stacking standoff of POP can be smaller. However, due to the mismatching of the welded shapes and area, the soldering strengths between the bumps 123 and the connecting pads 111D are different after reflowing the solder paste 130, especially, the reflowed solder paste 130 on the welding surface of the connecting pads 111D are planar which is weaker to shear stresses caused by thermal stresses of the first substrate 111 due to temperature variations. Furthermore, there is a layer of plated nickel/gold formed on the upper surface of the connecting pads 111D where the gold will diffuse into the solder paste 130 to form brittle gold/solder intermetallic layer which will reduce the bonding strength of the soldering interface. Therefore, as the semiconductor POP device 100 is operated under high speed or under poor thermal dissipation environment, the micro contacts will easily be broken at the interfaces between the connecting pads 111D and the solder paste 130 or at the bumps 123.

SUMMARY OF THE INVENTION

The main purpose of the present invention is to provide a semiconductor POP (package-on-package) device free from cracks at solder joints of micro contacts during package stacking which can evenly distribute the soldering shapes and area to avoid cracks at the interfaces of the micro contacts.

The second purpose of the present invention is to provide a semiconductor POP device free from cracks at solder joints of micro contacts during package stacking to enhance heat dissipation and to maintain fine pitches.

According to the present invention, a semiconductor Package-On-Package device primarily comprises a first semiconductor package, a second semiconductor package stacked on the first semiconductor package, and solder paste. The first semiconductor package includes a first substrate, a first chip, and a plurality of top bumps where the top bumps and the first chip are disposed on an upper surface of the first substrate. The second semiconductor package includes a second substrate, a second chip, and a plurality bottom bumps where the bottom bumps are disposed on a lower surface of the second substrate and the second chip on an upper surface of the second substrate. The solder paste joints the top bumps and the bottom bumps so that the bottom bumps are aligned with the corresponding top bumps with equally-shared welding areas and profiles.

DETAIL DESCRIPTION OF THE INVENTION

Please refer to the attached drawings, the present invention will be described by means of embodiment(s) below.

Figure 1:
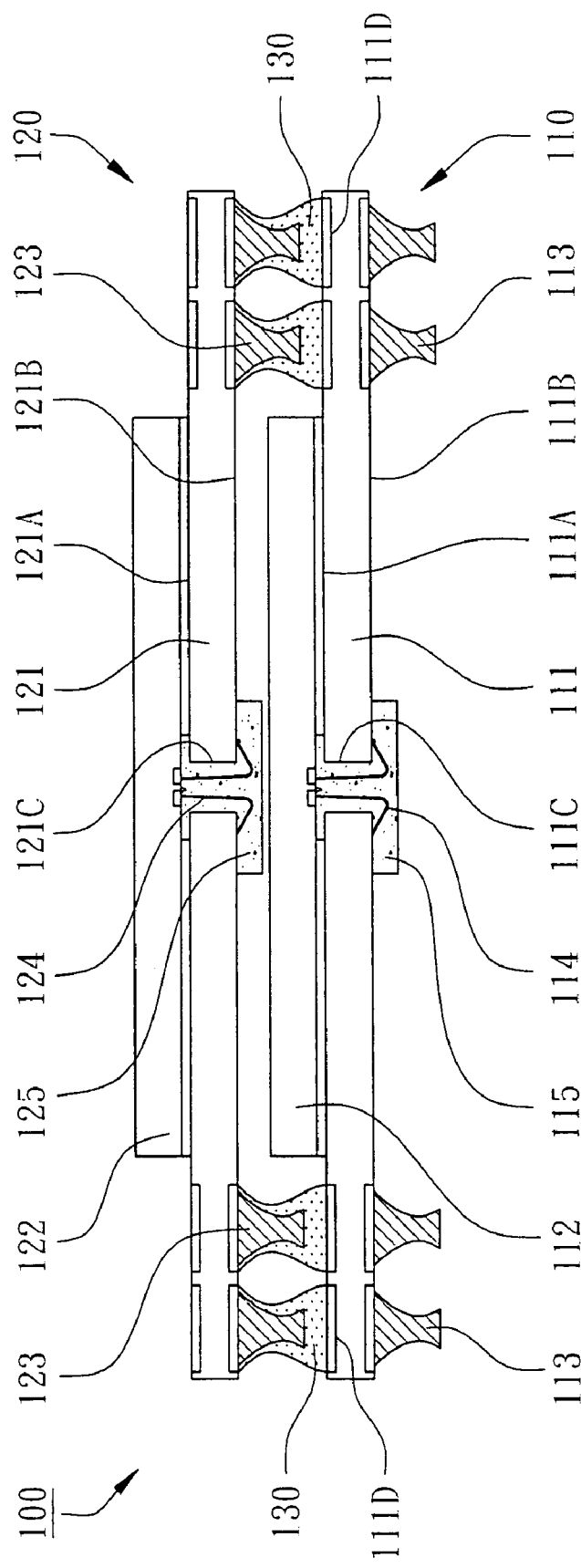
FIG. 1 shows a cross-sectional view of a conventional semiconductor POP device.
Figure 2:
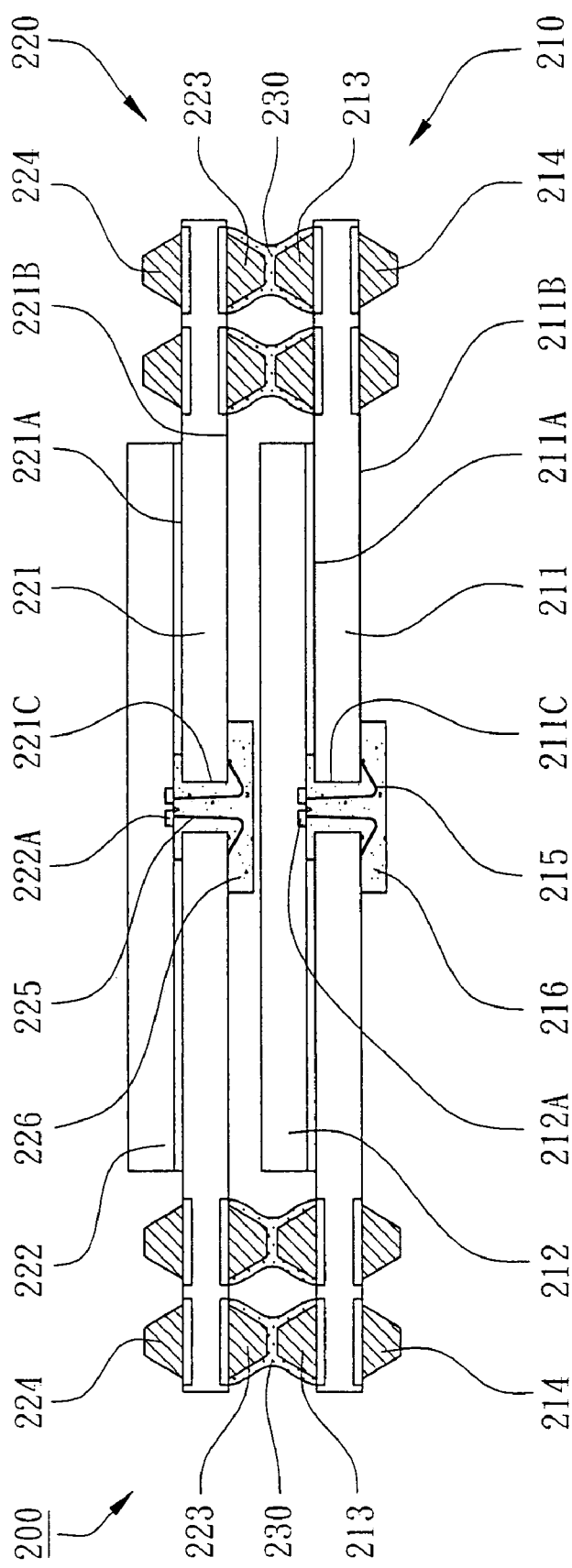
FIG. 2 shows a cross-sectional view of a semiconductor POP device according to the first embodiment of the present invention.

According to the first embodiment of the present invention, as shown in FIG. 2, a semiconductor POP device 200 primarily comprises a first semiconductor package 210, a second semiconductor package 220, and solder paste 230 where the second semiconductor package 220 is stacked on the first semiconductor package 210 and is jointed together by the solder paste 230.

The first semiconductor package 210 primarily includes a first substrate 211, a first chip 212, and a plurality of first top bumps 213 where the substrate 211 has an upper surface 211A and a lower surface 211B. Normally, the first substrate 211 is a double-layer or multi-layer printed circuit board. The first top bumps 213 and the first chip 212 are disposed on the upper surface 211A of the substrate 211. Therein, the active surface of the first chip 212 is attached to the upper surface 211A of the first substrate 211 by die-attach materials (DAM), die-attach tapes, B-stage adhesive, or flip chip bumps. In the present embodiment, the first substrate 211 has a first slot 211C penetrating through the upper surface 211A and the lower surface 211B of the first substrate 211 to expose a plurality of bonding pads 212A of the first chip 212. The first semiconductor package 210 further includes a plurality of first bonding wires 215 formed by wire-bonding and passing through the slot 211C so as to electrically connect the first bonding pads 212A of the first chip 212 to the substrate 211.

The first semiconductor package 210 further includes a first encapsulant 216 formed by molding or by dispensing in the slot 211C to encapsulate the first bonding wires 215. As shown in FIG. 2 again, the first chip 212 has a backside exposed from the first encapsulant 216 to enhance heat dissipation and to achieve a thinner and slighter package.

The second semiconductor package 220 includes a second substrate 221, a second chip 222, and a plurality of first bottom bumps 223 where the first bottom bumps 223 are disposed on a lower surface 221B of the substrate 221 and the second chip 222 on an upper surface 221A of the second substrate 221.

Preferably, the second semiconductor package 220 is the same as the first semiconductor package 210, which further includes a plurality of second bonding wires 225 and a second encapsulant 226 where the second bonding wires 225 passing through the second slot 221C to electrically connect a plurality of second bonding pads 222A of the second chip 222 to the second substrate 221. Moreover, the second bonding wires 225 are encapsulated by the second encapsulant 226. In the present embodiment, the first semiconductor package 210 further includes a plurality of second bottom bumps 214 disposed on the lower surface 211B of the first substrate 211. The second semiconductor package 220 further includes a plurality of second top bumps 224 disposed on the upper surface 221A of the second substrate 221.

Figure 3:
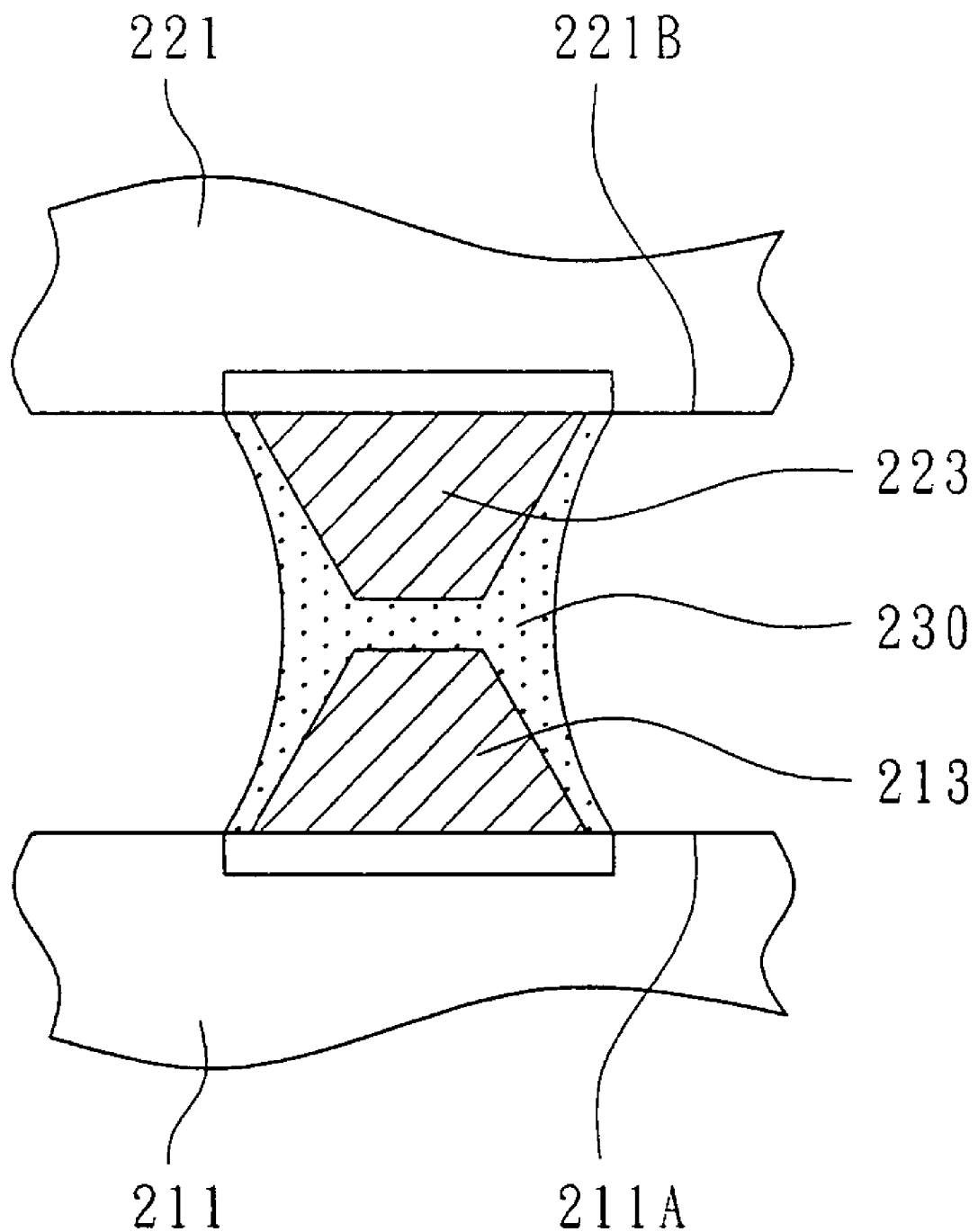
FIG. 3 shows a partially cross-sectional view of the semiconductor POP device at a micro-contact between the first semiconductor package and the second semiconductor package according to the first embodiment of the present invention.

The solder paste 230 joints the first top bumps 213 and the first bottom bumps 223 by reflowing when the second semiconductor package 220 is stacked on the first semiconductor package 210. The first top bumps 213 are aligned with the corresponding first bottom bumps 223 during reflowing. Moreover, as shown in FIG. 3, the bottom bumps 223 and the corresponding top bumps 213 both have equally-shared welding areas and profiles. Normally, the solder paste 230 is lead-free solder with 96.5% of tin-3% of silver-0.5% of copper where the solder paste 230 is reflowed at 217° C. and will become completely wetting when the maximum temperature of 245° C. is reached during reflow. Therefore, the melting points of the first top bumps 213 and the first bottom bumps 223 must be higher than the reflow temperature mentioned above.

As shown in FIG. 3, the first bottom bumps 223 and the first top bumps 213 are in the same dimensions and shapes such as semi-cones, cylinders, trapezoids, or irregular buttons. The first bottom bumps 223 and the first top bumps 213 can be copper pillars formed by plating or etching from thick metal plate, non-reflow bumps, or stud bumps formed by wire bonding. However, the first bottom bumps 223 and the first top bumps 213 should be paired micro contacts. It has been known that window BGA (wBGA) is implemented for DDR II DRAM with a solder ball diameter of 0.45 mm, with ball pad openings ranging from 0.35 mm to 0.4 mm on the substrate, and with a standoff height of 0.3 mm. Accordingly, the bump heights of the first bottom bumps 223 and the first top bumps 213 are ranged from 0.08 mm to 0.15 mm. The diameter on the top surfaces of the bumps 213 and 223 is above 0.06 mm and the diameter on the bottom surfaces of the bumps 213 and 223 is around 0.18 mm. After stacking, the gap between the first semiconductor package 210 and the second semiconductor package 220 (from the upper surface 211A of the first substrate 211 to the lower surface 211B of the second substrate 221) is around 0.275 mm. Therefore, in the present invention, the spacing between the two substrates 211 and 221 can even be shrunk and the requirements for high pin counts between the two small packages 210 and 220 are met.

As shown in FIG. 3, the solder paste 230 has a H-shaped profile so that the soldering strengths are the same to the top bumps 213 and to the bottom bumps 223 and can withstand stronger shear stresses, i.e., the first top bumps 213 and the first bottom bumps 223 have the same soldering shapes and dimensions. As shown in FIG. 3, the solder paste fills the welding space between the top and bottom bumps. This space is smaller than the bump height of each of the top and bottom bumps. Therefore, the solder paste 230 is evenly soldered so that the micro contacts are created and can not easily be broken during stacking to enhance board-level reliability.

Figure 4:
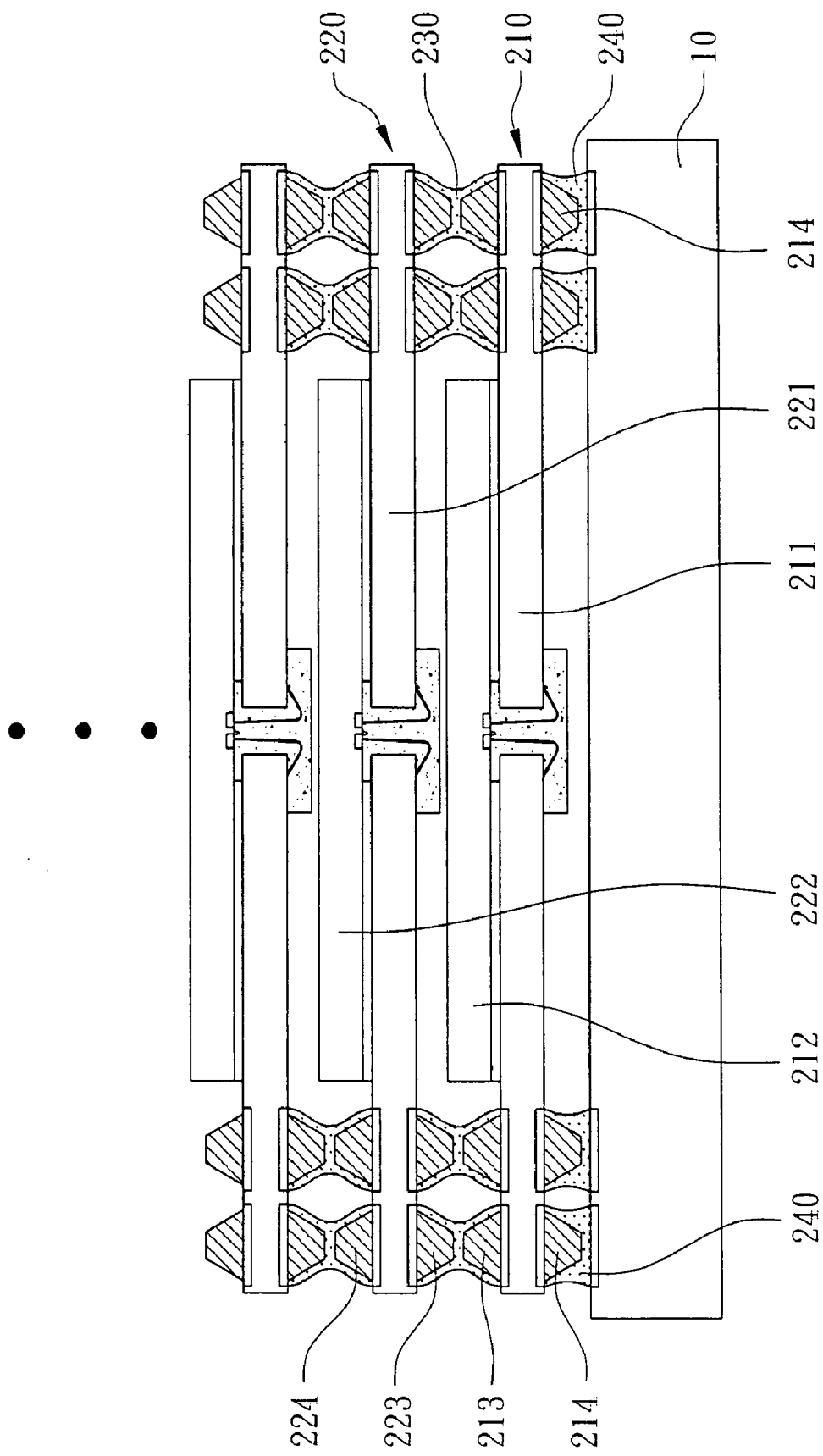
FIG. 4 shows a cross-sectional view of the semiconductor POP device formed by stacking a plurality of semiconductor packages on an external printed circuit board according to the first embodiment of the present invention.

As shown in FIG. 4, the stacked semiconductor device 200 further comprises a second solder paste 240 formed on the second bottom bumps 214 which act as the output terminals to an external printer circuit board 10. Expansion is possible on top of the stacked semiconductor device 200, one and more second semiconductor packages 220 are stacked to increase the memory capacities or to expand the functions.

Figure 5:
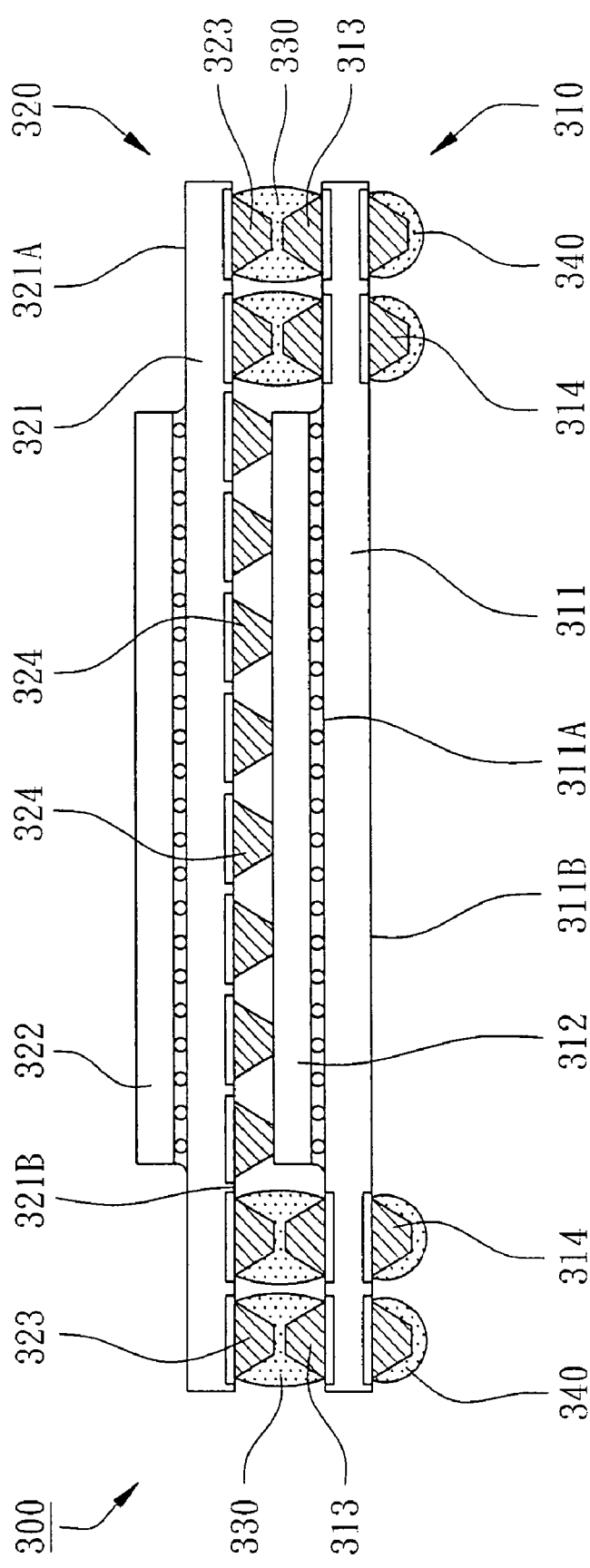
FIG. 5 shows a cross-sectional view of a semiconductor POP device according to the second embodiment of the present invention.

According to the second embodiment of the present invention, another stacked semiconductor device 300 is revealed as shown in FIG. 5, primarily comprising a first semiconductor package 310, a second semiconductor package 320, and a plurality of first solder paste 330. The first semiconductor package 310 includes a first substrate 311, a first chip 312, and a plurality of top bumps 313 where the top bumps 313 and the first chip 312 are disposed on an upper surface 311A of the first substrate 311. In the present embodiment, the first chip 312 is disposed on the first substrate 311 by flip chip mounting.

The second semiconductor package 320 includes a second substrate 321, a second chip 322, and a plurality of bottom bumps 323 where the bottom bumps 323 are disposed on a lower surface 321B of the second substrate 321 and the second chip 322 on an upper surface 321A of the second substrate 321.

The top bumps 313 are jointed with the bottom bumps 323 by reflowing the first solder paste 330 when the second semiconductor package 320 is disposed on the first semiconductor package 310. The bottom bumps 323 are aligned with the top bumps 313. The bottom bumps 323 and the corresponding top bumps 313 have equally-shared welding areas and profiles. Preferably, the top bumps 313 and the bottom bumps 323 are semi-cones and the solder paste after reflowing is in H-shape.

In this embodiment, the first semiconductor package 310 further comprises a plurality of bottom bumps 314 disposed on the lower surface 311B of the first substrate 311. The stacked semiconductor device 300 further comprises a second solder paste 340 formed on the bottom bumps 314 for surface mounting.

Preferably, the second semiconductor package 320 further includes a plurality dummy bumps 324 disposed on the lower surface 321B of the second substrate 321 and located above the first chip 312. The dummy bumps 324 are thermally coupled with the exposed backside of the first chip 312 of the first semiconductor package 310 for heat dissipation. The dummy bumps 324 will contact the backside of the first chip 312 to enhance heat dissipation and to maintain the standoff heights at fine pitch applications.

The above description of embodiments of this invention is intended to be illustrative and not limiting. Other embodiments of this invention will be obvious to those skilled in the art in view of the above disclosure.

What is claimed is:

1. A stacked semiconductor device comprising:
   a first semiconductor package including a first substrate, a first chip, and a plurality of top bumps, wherein the top bumps and the first chip are disposed on an upper surface of the first substrate;
   a second semiconductor package stacked on the first semiconductor package and including a second substrate, a second chip, and a plurality of bottom bumps, wherein the bottom bumps are disposed on a lower surface of the second substrate; and
   solder paste jointing the top bumps and the bottom bumps so that the bottom bumps are aligned with the corresponding top bumps with equally-shared welding areas and profiles;
      wherein the solder paste has H-shaped profiles to form a welding spacing between the top bumps and the bottom bumps which is smaller than a bump height of each of the top bumps and the bottom bumps.

2. The stacked semiconductor device as claimed in claim 1, wherein the second chip is disposed on an upper surface of the second substrate.

3. The stacked semiconductor device as claimed in claim 1, wherein the first semiconductor package further comprises a plurality of second bottom bumps disposed on a lower surface of the first substrate.

4. The stacked semiconductor device as claimed in claim 3, further comprising second solder paste formed on the second bottom bumps.

5. The stacked semiconductor device as claimed in claim 1, wherein the second semiconductor package further comprising a plurality of second top bumps disposed on an upper surface of the second substrate.

6. The stacked semiconductor device as claimed in claim 1, wherein the first substrate has a slot, the first semiconductor package further includes a plurality of first bonding wires passing through the first slot to electrically connect the first chip with the first substrate.

7. The stacked semiconductor device as claimed in claim 6, wherein the first semiconductor package further includes a first encapsulant formed in the first slot to encapsulate the first bonding wires.

8. The stacked semiconductor device as claimed in claim 7, wherein the first chip has a backside exposed from the first encapsulant.

9. The stacked semiconductor device as claimed in claim 7, wherein the second semiconductor package is the same as the first semiconductor package and includes a plurality of second bonding wires and a second encapsulant.

10. The stacked semiconductor device as claimed in claim 1, wherein the bottom bumps and the top bumps have the same dimensions.

11. The stacked semiconductor device as claimed in claim 1, wherein the bottom bumps and the top bumps are semi-cones or cylinders.

12. The stacked semiconductor device as claimed in claim 1, wherein the bottom bumps and the top bumps are copper pillars.

13. The stacked semiconductor device as claimed in claim 1, wherein the second semiconductor package further includes a plurality of dummy bumps disposed on the lower surface of the second substrate and located above the first chip of the first semiconductor package for heat dissipation.

14. The stacked semiconductor device as claimed in claim 13, wherein the dummy bumps are thermally coupled with the first chip.

15. The stacked semiconductor device as claimed in claim 1, wherein the solder paste is lead-free solder.

16. A stacked semiconductor device comprising a plurality of stacked semiconductor packages, each including a substrate, a chip, a plurality of bottom bumps, and a plurality of top bumps, wherein the bottom bumps are disposed on a lower surface of the substrate and the top bumps on an upper surface of the substrate, wherein the top bumps and the bottom bumps have equally-shared welding areas and profiles; the stacked semiconductor device further comprising solder paste between the top bumps and the connected bottom bumps, wherein the solder paste has H-shaped profiles to form a welding spacing between the top bumps and the bottom bumps which is smaller than a bump height of each of the top bumps and the bottom bumps.

17. The stacked semiconductor device as claimed in claim 16, wherein each substrate has a slot, each semiconductor package further includes a plurality of bonding wires passing through the slot to electrically connect the chip with the substrate.

18. The stacked semiconductor device as claimed in claim 17, wherein each semiconductor package further comprising an encapsulant formed in the slot to encapsulate the bonding wires.

19. The stacked semiconductor device as claimed in claim 18, wherein each chip has a backside exposed from the corresponding encapsulant.

20. The stacked semiconductor device as claimed in claim 16, wherein the bottom bumps and the top bumps are semi-cones or cylinders.

21. The stacked semiconductor device as claimed in claim 16, wherein the bottom bumps and the top bumps are copper pillars.

22. The stacked semiconductor device as claimed in claim 16, wherein each semiconductor package further includes a plurality of dummy bumps disposed on the lower surface of the substrate for heat dissipation.

23. The stacked semiconductor device as claimed in claim 1, wherein the solder paste completely covers the top bumps and the bottom bumps and extends to a plurality of connecting pads on which the top bumps and the bottom bumps are bonded.

24. The stacked semiconductor device as claimed in claim 16, wherein the solder paste completely covers the top bumps and the bottom bumps and extends to a plurality of connecting pads on which the top bumps and the bottom bumps are bonded.

* * * * *